(12) United States Patent
Viala

(10) Patent No.: US 11,017,940 B2
(45) Date of Patent: May 25, 2021

(54) INTEGRATED CIRCUIT COMPRISING A VARIABLE INDUCTOR

(71) Applicant: Commissariat a l'energie atomique et aux energies alternatives, Paris (FR)

(72) Inventor: Bernard Viala, Grenoble (FR)

(73) Assignee: Commissariat a l'energie atomique et aux energies alternatives, Paris (FR)

(*) Notice: Subject to any disclaimer, the term of this patent is extended or adjusted under 35 U.S.C. 154(b) by 68 days.

(21) Appl. No.: 16/426,259

(22) Filed: May 30, 2019

(65) Prior Publication Data
US 2019/0371518 A1  Dec. 5, 2019

(30) Foreign Application Priority Data
May 30, 2018  (FR) .................................. 18 54622

(51) Int. Cl.
| H01F 27/34 | (2006.01) |
|---|---|
| H01F 27/28 | (2006.01) |
| H01F 27/29 | (2006.01) |
| H01F 29/00 | (2006.01) |
| H01L 23/522 | (2006.01) |
| H01L 49/02 | (2006.01) |

(52) U.S. Cl.
CPC ......... *H01F 27/34* (2013.01); *H01F 27/2804* (2013.01); *H01F 27/29* (2013.01); *H01F 29/00* (2013.01); *H01L 23/5227* (2013.01); *H01L 28/10* (2013.01); *H01F 2027/2809* (2013.01); *H01F 2027/348* (2013.01)

(58) Field of Classification Search
CPC ..... H03H 7/427; H01F 27/29; H01F 27/2804; H01F 27/23; H01F 27/34; H01F 2027/2809

USPC ......................................................... 333/177
See application file for complete search history.

(56) References Cited

U.S. PATENT DOCUMENTS

| 2,896,491 A | 7/1959 | Lover |
|---|---|---|
| 5,095,357 A | 3/1992 | Andoh et al. |
| 6,493,861 B1 | 12/2002 | Li et al. |

(Continued)

FOREIGN PATENT DOCUMENTS

| EP | 1 213 729 A1 | 6/2002 |
|---|---|---|
| FR | 2 525 776 A1 | 10/1983 |
| WO | WO 2011/034205 A1 | 3/2011 |
| WO | WO 2011/118072 A1 | 9/2011 |
| WO | WO 2017/217308 A1 | 12/2017 |

OTHER PUBLICATIONS

French Preliminary Search Report dated Apr. 2, 2019 in French Application 18 54622, filed on May 30, 2018 (with English translation of categories of cited documents & Written Opinion).

(Continued)

*Primary Examiner* — Rakesh B Patel
(74) *Attorney, Agent, or Firm* — Oblon, McClelland, Maier & Neustadt, L.L.P.

(57) ABSTRACT

This integrated circuit comprises an inductor formed by at least a first coil and a second coil which are magnetically coupled together. Each of the first and second coils comprises a metal line which extends continuously, in a plane, between a first end and second end, said metal line following a winding path around an axis of the coil parallel to the plane, this metal line comprising for this purpose a succession of sections which each intersect the axis of the coil, and the sections of this succession are electrically connected in series with each other.

12 Claims, 3 Drawing Sheets

(56) References Cited

U.S. PATENT DOCUMENTS

| | | |
|---|---|---|
| 7,046,113 B1 | 5/2006 | Okamoto et al. |
| 2003/0061591 A1 | 3/2003 | Li et al. |
| 2004/0238929 A1 | 12/2004 | Anzai et al. |
| 2005/0263847 A1 | 12/2005 | Anzai et al. |
| 2006/0267216 A1 | 11/2006 | Li et al. |
| 2015/0008767 A1 | 1/2015 | Shinoda et al. |
| 2017/0294833 A1* | 10/2017 | Yang .................. H01F 27/2804 |
| 2019/0088403 A1 | 3/2019 | Ito |

OTHER PUBLICATIONS

P. Agarwal et al., "25.3 GHz, 4.1 mW VCO with 34.8% Tuning Range Using a Switched substrate—Shield Inductor", Dept. of EECS, Washington State University, Pullman, USA, pp. 1-4.

P. Agarwal et al., "Switched Substrate-Shield-Based Low-Loss CMOS Inductors for Wide Tuning Range VCOs", IEEE Transactions on Microwave Theory and Techniques, vol. 65, No. 8, Aug. 2017, pp. 2964-2976.

F. Banitorfian, et al., "Evaluation and analysis of methods for fixed and variable MEMS inductors design", Journal of Microelectronics, Electronic Components and Materials, vol. 44, No. 2, 2014, pp. 87-103.

L. Li, et al., "Tunable Inductors Using Integrated Vanadium Dioxide Phase Change Thin films", pp. 1-9.

S. Ali, et al., "Reconfigurable High Efficiency Power Amplifier with Tunable Coupling Coefficient Based Transformer for 5G Applications", IEEE, 2017, pp. 1177-1180.

S. Wang, et al., "Tunable Inductors Using Vanadium Dioxide as the Control Material", Microwave and Optical Technology Letters / vol. 59, No. 5, May 2017, pp. 1057-1061.

* cited by examiner

INTEGRATED CIRCUIT COMPRISING A VARIABLE INDUCTOR

The invention relates to an integrated circuit comprising an inductor.

Known integrated circuits comprise:

a substrate extending mainly in a plane called "substrate plane", an inductor comprising first and second coils which are magnetically coupled together, this magnetic coupling resulting in the formation of a mutual inductance M between these two coils when the inductor is energized, this mutual inductance M being defined by the following relation: M=k sqrt($L_1 L_2$), where:

k is a magnetic coupling coefficient, the absolute value of this coefficient k being comprised within the range [0.4-1], and $L_1$ and $L_2$ are self-inductances of the first and second coils, respectively, sqrt( . . . ) is the square root function.

For example, such an integrated circuit is disclosed with reference to FIG. 11c of application U.S. Pat. No. 5,095,357.

Prior art is also known from: US 2015/008767 A1, WO 2011/118072 A1, EP 1213729 A1, WO 2017/217308 A1, WO 2011/034205 A1, FR 2525776 A1, US 2004/238929 A1, U.S. Pat. No. 6,493,861 B1.

The advantage of using two coils to form an inductor is that, with such an arrangement, it is possible to obtain both very small inductances, namely less than 100 PH, as well as much larger inductances, namely much larger than the self-inductance of each of these coils. To achieve this, the absolute value of the magnetic coupling coefficient k between the coils must be high, i.e. greater than 0.4 or 0.5. It should be remembered that the absolute value of the magnetic coupling coefficient may not be greater than 1. For this purpose, the coils are arranged relative to each other so as to be magnetically coupled together tightly. Furthermore, often, in order to increase the magnetic coupling between the coils, the latter are wound around a common magnetic core.

In the case of the inductor of an integrated circuit, each of these coils is in the form of a loop or spiral, as described in U.S. Pat. No. 5,095,357 or EP 1213729. This loop or spiral is formed in a metallization layer parallel to the substrate layer of the integrated circuit. These coils are arranged above one other and mechanically separated by a layer of dielectric material. Furthermore, in the case of integrated circuits, the substrate generally comprises at least one layer of conductor or semiconductor material such as silicon. In this case, when the inductor is energized, the coils generate eddy currents in this conductor or semiconductor material, this resulting in a deterioration in the performance of the inductor. For example, this causes a significant deterioration in the quality factor of the inductor and the value of its effective inductance is modified.

In order to limit this problem, it has already been proposed to magnetically isolate the conductor or semiconductor layer of the coils by introducing an electro-magnetic screen such as a segmented ground plane between the coils and this conductor or semiconductor layer. In this latter case, the ground plane must be situated as far as possible from the coils in order to limit the capacitive couplings between this ground plane and these coils. Thus, this solution complicates the production of the integrated circuit.

The invention aims to propose such an integrated circuit in which the generation of the eddy current by the coils is limited while remaining easy to manufacture. It therefore relates to an integrated circuit in accordance with claim 1.

The embodiments of this integrated circuit may comprise one or more of the characteristic features of the dependent claims.

The invention will be understood more clearly upon reading of the description provided below solely by way of a non-limiting example with reference to the drawings in which.

In these figures the same reference numbers are used to indicate the same elements. In the continuation of this description, the characteristic features and functions well-known to the person skilled in the art will not be described in detail.

CHAPTER I: DETAILED DESCRIPTION OF EMBODIMENTS

Figure 1:
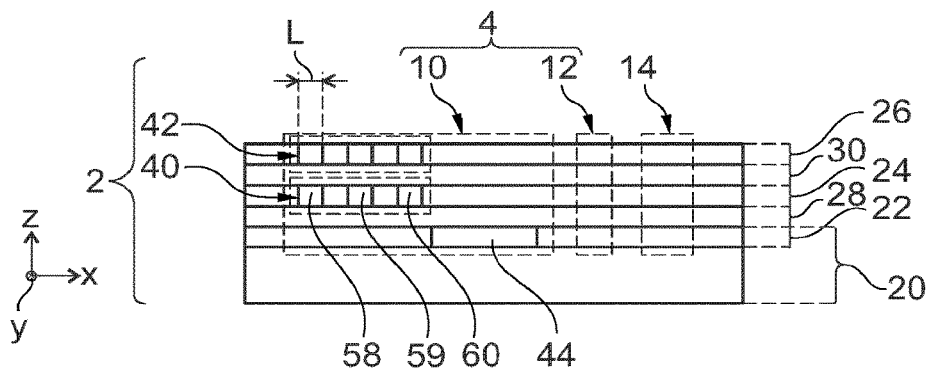
FIG. 1 is a vertically sectioned schematic view of an integrated circuit comprising an inductor.
Figure 2:
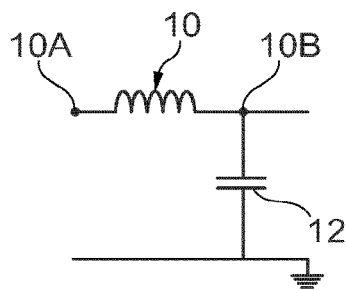
FIG. 2 is an electronic diagram of a filter comprising the inductor of the integrated circuit according to FIG. 1.

FIG. 1 shows an integrated circuit 2 which comprises an adjustable low-pass filter 4. The electrical diagram of the filter 4 is shown in FIG. 2. This filter 4 comprises an inductor 10 and a capacitor 12. The cut-off frequency $f_c$ of the filter 4 is defined by the following relation: $f_c=1/(2\pi$ sqrt(LC)), where:

L is the value of the inductor 10,

C is the capacitance of the capacitor 12, and sqrt( . . . ) is the square root function.

The inductor 10 comprises an input terminal 10A and an output terminal 10B. Here, the terminal 10A receives the electrical signal to be filtered. The terminal 10B is connected to the capacitor 12.

The frequency $f_c$ may be adjusted so as to assume, alternately, a value from among three different values indicated as $f_1$, $f_2$ and $f_3$ below. The aim is to obtain a filter 4 in which the value $f_1$ is at least twice, and preferably at least five or ten times greater than the value $f_3$. The value $f_2$ is an intermediate value between the values $f_1$ and $f_3$. For this purpose, in this embodiment, the inductor 10 is a variable inductor which may be adjusted so as to assume, alternately, a value from among three different values indicated as $L_1$, $L_2$ and $L_3$. In this embodiment, the capacitance of the capacitor 12 is fixed and cannot be adjusted. In these conditions, in order for the value $f_1$ to be twice the value $f_3$, the value $L_1$ of the inductor 10 must be four times smaller than the value $L_3$. The value $L_2$ of the inductor 10 allows the value $f_2$ of the cut-off frequency $f_c$ to be obtained.

As shown by means of a broken-line box in FIG. 1, the integrated circuit 2 may also comprise other electronic components 14 which will not be described here in detail.

The integrated circuit 2 comprises a substrate 20 having at least one layer 22 of semiconductor or conductor material 22, inside which electronic or optical components are formed. Here, the layer 22 is made of semiconductor material such as monocrystalline silicon.

This substrate 20 extends mainly in a horizontal plane referred to below as "substrate plane".

In FIG. 1 and the following figures, the horizontal plane is represented by two directions X and Y of an orthogonal reference system. The direction Z of this orthogonal reference system corresponds to the vertical direction.

Hereafter, the terms such as "above", "below", "upper", "lower", are defined in relation to the direction Z.

Above the substrate 20, the integrated circuit comprises a stack of metallization layers which are mechanically separated from each other by dielectric layers made of electrically insulating material. In this application, "electrically insulating material" or "insulating material" indicates a material, the conductivity of which at 20° C. is less than $10^{-6}$ S/m or $10^{-10}$ S/m. Here, the dielectric layers are made of silicon dioxide ($SiO_2$). Typically, the metallization layers are made during a process for manufacture of the integrated circuit 2 referred to by the abbreviation BEOL ("Back End Of Line").

In order to simplify FIG. 1, only two metallization layers 24 and 26 and only two dielectric layers 28 and 30 are shown. From the bottom upwards, the stack of layers on the substrate 20 is as follows: the dielectric layer 28, the metallization layer 24, the dielectric layer 30 and the metallization layer 26. The dielectric layer 30 is therefore arranged between the metallization layers 24 and 26. The metallization layers 24 and 25 are for example chosen from among the metallization layers situated in the levels known by the references M5 to M9. These metallization layers are made of conductive material. In this application, "conductive material" or "electrically conductive material" indicates a material, the electrical conductivity of which at 20° C. is greater than $10^5$ S/m or $10^6$ S/m. Here, the metallization layers are made of copper. The thickness of each metallization layer is for example between 0.5 µm and 40 µm and, generally, is between 0.5 µm and 5 µm.

The thickness of the dielectric layer 30, indicated below as "e", lies for example between 0.5 µm and 50 µm and, generally, is between 0.5 µm and 10 µm. This thickness "e" is chosen as will be explained further below to obtain a desired value of a magnetic coupling coefficient k.

The inductor 10 comprises two serpentine coils 40 and 42 and a controllable circuit 44 for adjusting the value of the inductor 10. Each coil 40, 42 is entirely formed in one and the same metallization layer. For example, these coils are made by means of photolithography and therefore in particular by etching said metallization layer. Here, the coils 40 and 42 are formed, respectively, in the metallization layers 24 and 26.

In this embodiment, the coils 40 and 42 are structurally identical. Thus, hereafter, only the structure of the coil 40 is described in greater detail. Moreover, they are arranged above one another in the vertical direction so as to be magnetically coupled together tightly.

In this application, "magnetically coupled together tightly" refers to the fact that the absolute value of the magnetic coupling coefficient K of the coils 40 and 42 is greater than 0.4 or 0.5 and preferably greater than 0.6 or 0.8 or 0.9. The magnetic coupling coefficient k is the coefficient used to define the mutual inductance value of the coils 40 and 42. It is pointed out that the mutual inductance value is defined by the following relation: M=k sqrt($L_{40}L_{42}$), where:

L40 and L42 are the self-inductance values of the coils 40 and 42, respectively, k is the magnetic coupling coefficient.

The value of the coefficient k depends in particular on the closeness of the coils to each other, the thickness "e" of the layer 30 and the arrangement of the coils in relation to each other. Finally, the coefficient k also depends on the relative permeability $\mu_{rv}$, in the vertical direction, of the material of the layer 30. Here, the material of the layer 30 does not have magnetic properties and its permeability $\mu_{rv}$ is equal to 1. Here, the relative permeability $\mu_{rv}$ is measured under normal temperature and pressure conditions.

In this embodiment, the coils 40, 42 are arranged above one another so that the orthogonal projection of the coil 40 in a horizontal plane coincides with the orthogonal projection of the coil 42 in this same horizontal plane. In this case, the intersection surface area of the orthogonal projections of the coils 40 and 42 in a same horizontal plane is equal to 100% of the surface area of the orthogonal projection of each of the coils 40 and 42 in this horizontal plane. With such an arrangement of the coils 40 and 42 and by choosing the thickness "e" in the possible range of thicknesses indicated above, the absolute value of the magnetic coupling coefficient k of these coils 40 and 42 may be easily made to assume a value greater than 0.4 and 0.5 and, by reducing the thickness "e", may be made to assume a value greater than 0.8 or 0.9 or 0.95.

Figure 3:
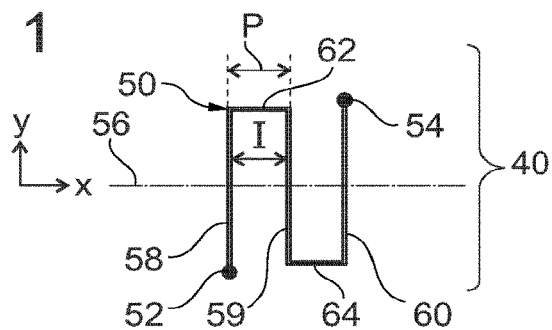
FIG. 3 is a schematic view, from above, of a coil of the inductor of the integrated circuit according to FIG. 1.

FIG. 3 shows in greater detail the structure of the coil 40. The coil 40 is formed in this embodiment by a single line 50 of metal. This line 50 extends horizontally from one end 52 to an end 54, following a winding path around a horizontal axis 56 of the coil 40. Here, the axis 56 is parallel to the direction X and the line 50 extends from the end 52 as far as the end 54, advancing in this direction X. The width of the line 50, indicated by "L" (FIG. 1), is constant over its entire length and is generally between 1 µm and 100 µm and, preferably between 1 µm and 20 µm or between 1 µm and 10 µm. The line 50 is for example made using the same methods as those used to manufacture the CMOS («Complementary Metal Oxide Semi-conductor») components.

The line 50 comprises a succession of N sections which each intersect the axis 56. N is a whole number greater than or equal to 2 or 3 and generally less than 100. Here, in order to simplify FIG. 3, only three sections 58 to 60 are shown.

In this embodiment, the sections 58 to 60 are identical to each other and spaced from each in the direction X at an identical distance indicated by "I" in FIG. 3. The distance "I" is therefore the distance, measured along the axis 56, which separates two sections immediately adjacent in the direction X.

In this description, "two sections immediately adjacent in the direction X" refers to two sections of the same line which are situated, in the direction X, alongside each other and between which no other section of the line is arranged. Thus, the section immediately adjacent to the section 58 in the direction X is the section 59 and the section immediately adjacent to the section 59 in the direction X is the section 60.

Preferably, the distance "I" is small compared to the width "L" of the line 50 so that two sections immediately adjacent in the direction X of the line 15 are magnetically coupled together. In order for there to be a good magnetic coupling between the sections immediately adjacent in the direction X, the distance "I" and the width "L" of the line 50 are chosen so that the ratio I/L is less than 3 or 1. Preferably, the ratio I/L is less than 0.1 or 0.05 or even less than 0.02.

Advantageously, the thickness "e" is also small compared to the width "L" of the line 50. However, the thickness "e" must not be too small in order to avoid creating too large a parasitic capacitance between the coils 40 and 42. Thus, in general, the thickness "e" is chosen so that the ratio e/L is greater than 0.1 and typically less than 0.5.

Advantageously, the thickness "e" is also small compared to the distance "I" of the line 50. Thus, in general, the thickness "e" is chosen so that the ratio e/I is less than 0.5 and, typically less than 0.1.

Since the distance "I" is constant and the sections 58 to 60 are identical to each other, these sections 58 to 60 are repeated along the axis 56 with a regular interval "P" (FIG. 3).

Only the section 58 is now described in more detail. The section 58 intersects the axis 56 at its center of gravity. Here, the section 58 is rectilinear and extends parallel to the direction Y. In these conditions, the section 58 intersects the axis 56 at its middle point.

The sections of the line 50 are connected electrically in series with each other so that the current flowing in any given section is systematically in phase opposition with the current flowing, at the same instant, in the section which is immediately adjacent in the direction X. For this purpose, here, the section immediately adjacent to the section 58 in the direction X is therefore the section 59 and the section immediately adjacent to the section 59 in the direction X is the section 60. The end of the section 58 situated below the axis 56 in FIG. 3 coincides with the end 52. The end of the section 58 situated above the axis 56 in FIG. 3 is electrically connected in series, by means of an additional section 62, with the end of the section 59 also situated above the axis 56 in FIG. 3. The end of the section 59 situated below the axis 56 in FIG. 3 is electrically connected in series, by means of an additional section 64, with the end of the section 60 also situated below the axis 56 in FIG. 3. The end of the section 60 situated above the axis 56 in FIG. 3 coincides with the end 54.

The additional sections 62 and 64 which are used to connect together the sections 58 to 60 in series do not intersect the axis 56. Here, these sections 62 and 64 are rectilinear and extend parallel to the direction X.

Figure 4:
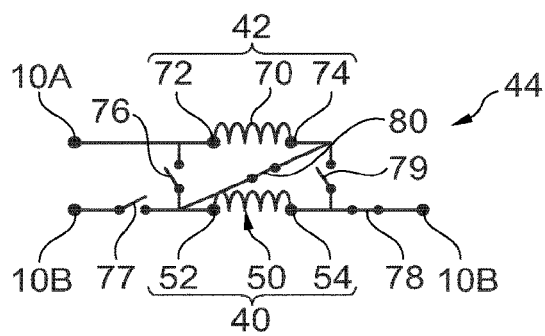

Hereafter, the metal line of the coil 42 is indicated by the reference number 70 (FIG. 4). The ends of the line 70 vertically aligned with the ends 52 and 54 are indicated, respectively, by the reference numbers 72 and 74 (FIG. 4).

The control circuit 4 is designed to vary the direction and/or the strength of the current flowing inside the coil 40 in relation to the direction and/or the strength of the current flowing at the same instant inside the coil 42. Such a variation in the direction and/or strength of the current in one of the coils in relation to the other one modifies the value of the mutual inductance between these coils and therefore the value L of the inductor 10.

A first embodiment of this circuit 4 is shown in FIG. 4. In this first embodiment, the circuit 44 comprises five controllable switches 76 to 80. Each of these switches 76 to 80 can be reversibly switched, in response to a command signal, between an open position and a closed position. In the closed position, the resistance of the switch is small (for example 1 Ohm) and it allows the current to pass through. In the open position, the resistance of the switch is ten or hundred times greater and the switch prevents the current from passing through. In this case these are switches which are able to conduct and, alternately, interrupt the flow of a high-frequency current. "High-frequency current" in this application refers to an alternating current, the fundamental frequency of which is greater than 1 GHz or 10 GHz or 40 GHz. In this embodiment, the switches are preferably switches made of phase-change materials. These materials are more commonly referred to by the abbreviation PCM. For example, the material used is vanadium dioxide ($VO_2$). The switching of such a switch between these open and closed positions is for example performed by varying its temperature. These switches are well-known. For example, the reader may consult the following article on this subject: Shu Wang et al: «Tunable inductors using vanadium dioxide as the control material», Microwave and Optical Technology Letters, volume 59, n° 5, May 2017, pages 1057 to 1061.

For example, the circuit 44 and its switches are formed in the layer 22 in a conventional manner. The circuit 44 is connected to the coils 40 and 42, for example, by metal vias which cross the dielectric layers 28 and 30.

Figure 5:
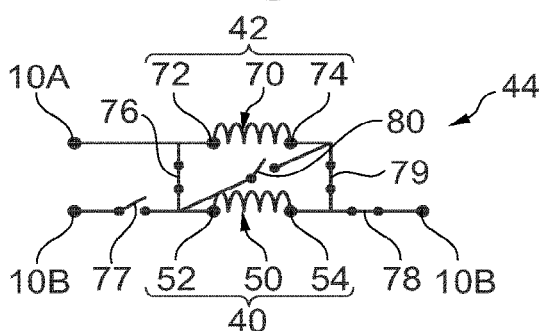
FIGS. 4, 5 and 6 are electronic diagrams of a circuit for controlling the inductor of the integrated circuit according to FIG. 1.
Figure 6:
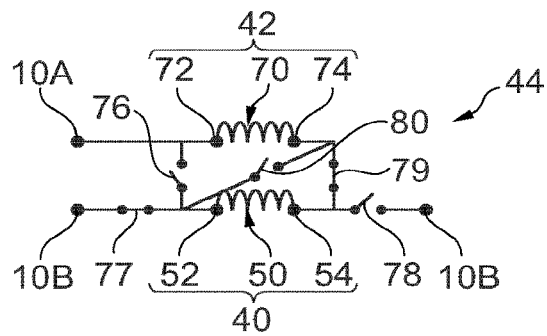

Here, the switches 76 to 80 are arranged so as to connect, alternately, the coils 40 and 42 in a first, second and third configuration shown, respectively, in FIGS. 6, 5 and 4. For this purpose, the switch 76 is directly connected between the ends 52 and 72. In this application, "directly connected" refers to the fact that the component is electrically connected without passing via one of the coils 40 or 42. In general, the component is therefore directly connected by means of a simple wire connection. The switch 77 is directly connected between the terminal 10B and the end 52. The switch 78 is directly connected between the end 54 and the terminal 10B. The switch 79 is directly connected between the ends 54 and 74. The switch 80 is directly connected between the ends 52 and 74.

According to the first configuration (FIG. 6), the switches 77 and 79 are in the closed position and the switches 76, 78 and 80 are in the open position. In this configuration, the coils 40 and 42 are connected in series between the terminals 10A and 10B. Furthermore, in this first configuration, the current which flows inside the section 58 is in phase opposition with the alternating current flowing, at the same instant, inside the section of the coil 42 which is immediately adjacent thereto in the vertical direction. The section of the coil 42 immediately adjacent to the section 58 is the section of the coil 42 which is closest to the section 58. This is therefore the section of the coil 42 situated immediately above the section 58 in the direction Z. The description provided above for the particular case of the section 58 is also applicable to the sections 59 and 60.

Figure 8:
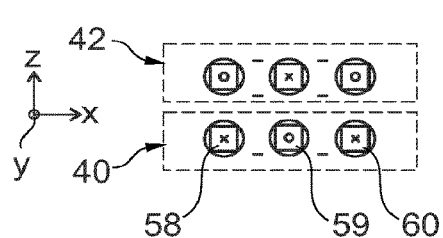

The direction of flow in the sections of the coils 40 and 42 connected according to the first configuration is shown in FIG. 8. In this FIG. 8, a dot inside a section indicates that the current is flowing inside this section in the opposite direction to the direction Y. Conversely, a cross inside a section indicates that the current is flowing inside the section in the direction Y. In the case of the first configuration, the field lines generated by the coils 40 and 42 interact in a destructive manner. Consequently, the mutual inductance M is subtracted from the self-inductance of each of the coils 40 to 42. The value $L_1$ of the inductor 10 is therefore defined by the following relation: $L_1 = 2 L_p(1-|k|)$, where:

$L_p$ is the value of the self-inductance of the coil 40 or 42, and the symbol ski denotes the absolute value of the coefficient k.

Here, since the coils 40 and 42 are identical, they have the same self-inductance value $L_p$.

According to the second configuration (FIG. 5), the switches 76, 78 and 79 are in the closed position and the switches 77 and 80 are in the open position. In this second configuration, the coils 40 and 42 are connected in parallel between the terminals 10A and 10B. In this second configuration, the current which flows inside the section 58 is in phase with the alternating current flowing, at the same instant, inside the section of the coil 42 which is immediately adjacent thereto. This applies also to the sections 59 and 60. However, all things being equal elsewhere, in this second configuration, the strength of the current which flows inside each of the coils 40 and 42 is halved compared to the strength of the current which would flow in these coils if they were connected together according to the first configuration. Thus, in this second configuration, the value $L_2$ of the inductor 10 is defined by the following relation: $L_2=0.5 L_p(1+|k|)$.

Figure 7:
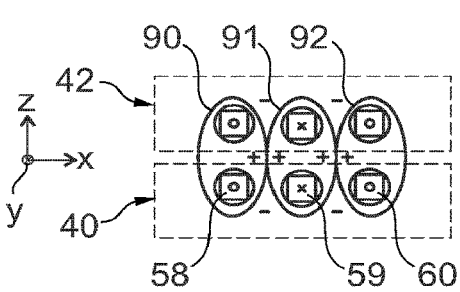
FIGS. 7 and 8 are vertically sectioned schematic views of two coils of the inductor of the integrated circuit according to FIG. 1.

According to the third configuration (FIG. 4), the switches 78 and 80 are in the closed position and the switches 76, 77 and 79 are in the open position. According to this third configuration, the coils 40 and 42 are connected in series between the terminals 10A and 10B. On the other hand, differently from the first configuration, the current which flows inside the section 58 is in phase with the current flowing, at the same instant, inside the section of the coil 42 which is immediately adjacent thereto. This is the case also for the sections 59 and 60. Using the same symbols as those defined with reference to FIG. 8, the direction of flow of the current in the sections of the coils 40 and 42 is shown in FIG. 7 in the case of this third configuration. The lines 90, 91 and 92 (FIG. 7) around each pair of sections superimposed vertically are intended to indicate that the field lines generated by these sections interact in a constructive manner. Thus, the mutual inductance M is added to the self-inductance of each of the coils 40 and 42. According to this third configuration, the value $L_3$ of the inductor 10 is defined by the following relation: $L_3=2 L_p(1+|k|)$.

The ratio $L_3/L_1$ is equal to $(1+|k|)/(1-|k|)$. This ratio is therefore all the greater the greater the coefficient k. For example, it is possible to obtain a ratio $L_3/L_1$ equal to 100 when the coefficient k is equal to 0.98.

During operation of the integrated circuit 2, depending on the desired frequency $f_c$, a command signal is transmitted to the inductor 10. In response, the circuit 44 switches the switches 76 to 80 so as to obtain the configuration corresponding to the desired frequency $f_c$.

Figure 9:
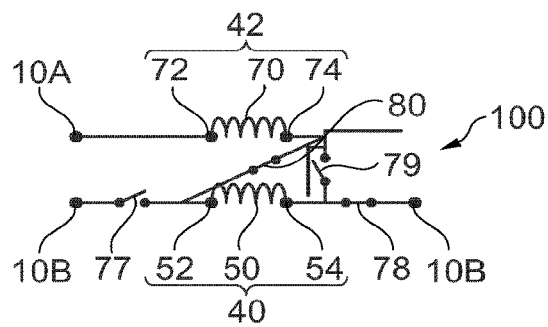
FIGS. 9 and 10 are electronic diagrams of two possible variants of the control circuit according to FIG. 4.

FIG. 9 shows a control circuit 100 able to be used instead of the circuit 44. The circuit 100 is identical to the circuit 44, except for the switch 76 which is omitted. With the circuit 100, therefore, it is possible to implement only the first and third configurations described above. In this case, the variable inductor 10 may assume solely the values $L_1$ and $L_3$.

Figure 10:
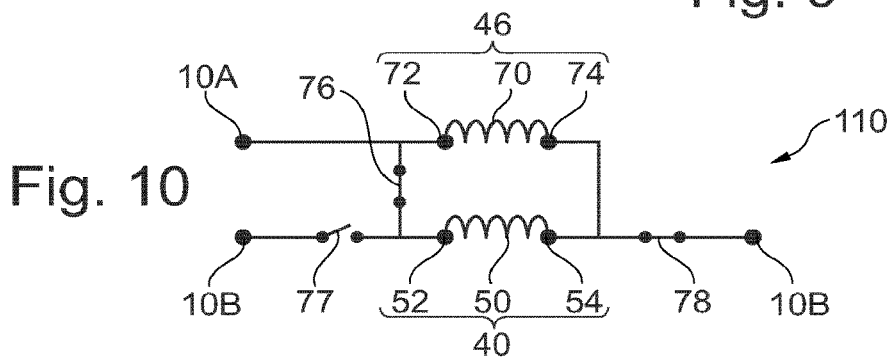

FIG. 10 shows a control circuit 110 able to be used in place of the circuit 44. The circuit 110 is identical to the circuit 4, except that the switch 80 is omitted and the switch 79 is replaced by a wire connection between the ends 54, 74. The circuit 110 is therefore able to implement only the first and second configurations described above. In this case, the variable inductor may assume solely the values $L_1$ and $L_2$.

Figure 11:
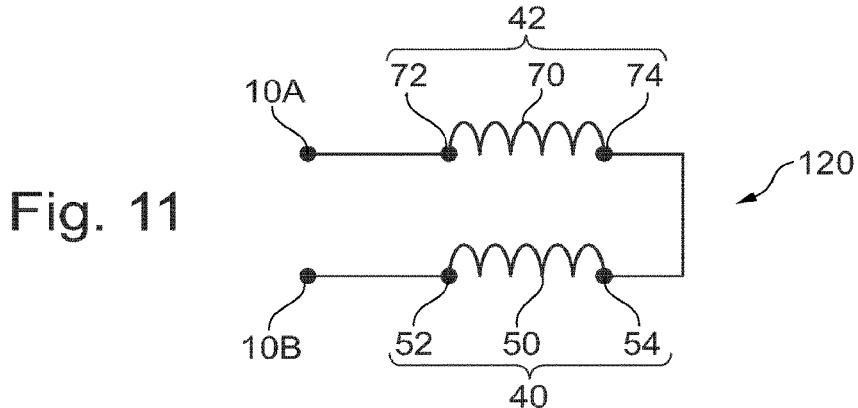
FIG. 11 is an electronic diagram of a variant of the integrated circuit according to FIG. 1, in which the inductor is a fixed inductor.

FIG. 11 shows an inductor 120 which is not protected by the present application. The inductor 120 may be used in place of the inductor 10. The inductor 120 is identical to the inductor 10, except that the control circuit 44 is omitted and the coils 40 and 42 are permanently connected in the first configuration. In this embodiment, the coils 40, 42 are arranged relative to each other in such a way that the absolute value of the coefficient k is greater than 0.6 and, preferably, greater than 0.9 or 0.95. Typically, for this purpose, the thickness "e" of the layer 30 is reduced until it reaches the desired value of the coefficient k. In these conditions, the value of the inductor 120 is generally less than 100 pH or 10 pH. Such inductors with a very low value are useful in particular for very high-frequency applications, namely applications where the fundamental frequency of the electric current which flows through the inductor 120 is greater than 20 GHz or 40 GHz.

Figure 12:
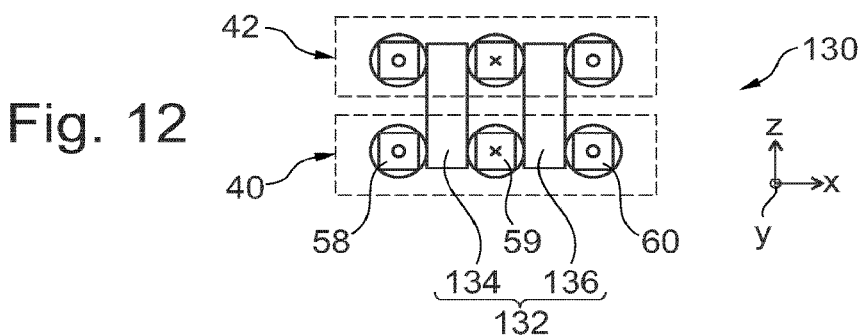
FIG. 12 is a vertically sectioned schematic view of a variant of the inductor of the integrated circuit according to FIG. 1.

FIG. 12 shows an inductor 130 able to be used in place of the inductor 10 or the inductor 120. The inductor 130 is identical to the inductor 10 or 120, except that it has also a magnetic core 132 for increasing the value of the magnetic coupling coefficient k between the coils 40 and 42. In order to simplify FIG. 12, only the coils 40 and 42 and the core 132 are shown.

The core 132 concentrates the magnetic field lines generated by the coil 40 and guides them as far as the coil 42. For this purpose, the core 132 comprises magnetic bars 134 and 136 which extend vertically through the dielectric layer 30. Here, the bar 134 has a bottom part situated between the sections 58 and 59. The bar 134 extends vertically from this bottom part as far as a top part situated between the sections of the coil 42 which are immediately adjacent, respectively, to the sections 58 and 59. The bar 134 is made of a magnetic material, the relative permeability $\mu_{rv}$ of which in the vertical direction is strictly greater than 1 and greater than its relative permeability $\mu_{rh}$ in the direction X. For example, the bar 134 consists of a porous matrix of aluminum oxide ($Al_2O_3$) inside which magnetic nanowires which extend mainly vertically are embedded. The bar 134 may also consist of a matrix of polymer material inside which magnetic nanoparticles incorporated in this matrix are embedded. These magnetic nanoparticles are arranged inside this matrix to form chains of nanoparticles which extend mainly vertically. A method of manufacturing such a magnetic bar is for example described in the application EP 3028855 using magnetic nanoparticles instead of conductive nanoparticles.

The bar 136 is for example identical to the bar 134, except that it is positioned between the sections 59 and 60.

FIGS. 13 to 17 show other possible embodiments of a serpentine coil able to be used instead of the coils 40 and 42 in order to form the inductor 10, 120 or 130. In order to simplify these and the following figures, the metal line which forms this coil is simply shown as a line.

Figure 13:
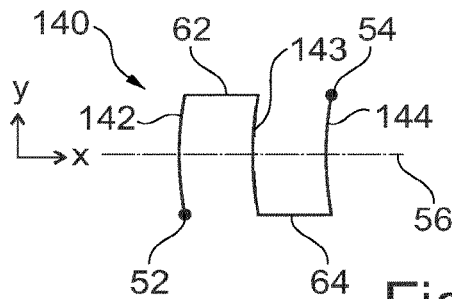
FIGS. 13 to 17 are schematic views, from above, of different possible embodiments of the inductor coil of the integrated circuit according to FIG. 1.

FIG. 13 shows a coil 140 which is identical to the coil 40, except that the sections 58 to 60 are replaced, respectively, by sections 142 to 144. The sections 142 to 144 are identical to the sections 58 to 60 except that they are in the form of a circle arc instead of being rectilinear. Each of these sections 142 to 144 is symmetrical relative to the axis 56. The radius of curvature of each of these sections 142 to 144 is twice or ten times greater than the interval "P" so as not to form a loop.

Figure 14:
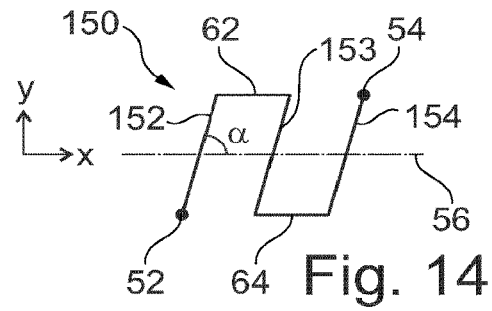

FIG. 14 shows a coil 150 which is identical to the coil 40, except that the sections 58 to 60 are replaced, respectively, by sections 152 to 154. The sections 152 to 154 are identical to the sections 58 to 60 except that they intersect the axis 156 forming an angle α other than 90°. For example, the angle α is between 50° and 80°.

Figure 15:
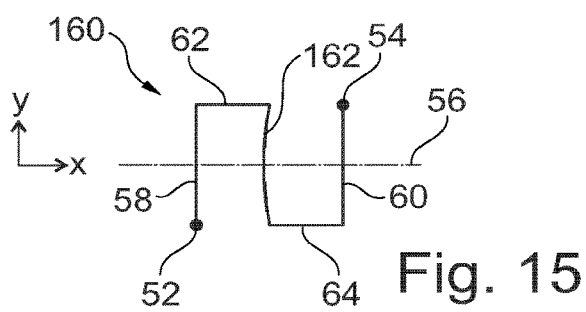

FIG. 15 shows a coil 160 identical to the coil 40, except that the section 59 is replaced by a section 162. The section 162 is not identical to the section 58 immediately preceding it. For example here, the section 162 is identical to the section 143, while the sections 58 and 60 are rectilinear.

Figure 16:
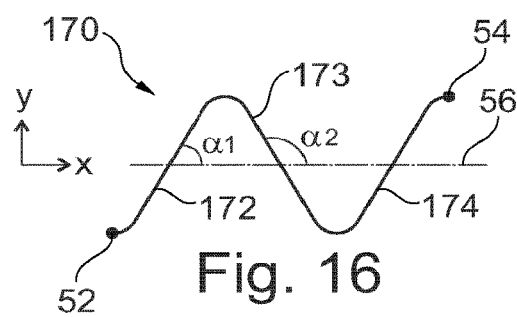

FIG. 16 shows a coil 170 identical to the coil 40, except that the sections 58 to 60 are replaced, respectively, by sections 172 to 174. Here the metal line of the coil 170 winds around the axis 58 following a sinusoidal or sawtooth path. In this embodiment, the tangent at the intersection between the section 172 and the axis 56 forms an angle $\alpha_1$ smaller than 90° and generally smaller than 80° or 60°. The tangent at the intersection between the section 173 and the axis 56 forms an angle $\alpha_2$ equal to (180°-$\alpha_1$). In other words, the section 172 is inclined in one direction and the section 173 is inclined in the opposite direction. Thus, if the axes tangential to the lines 172 and 173 at their point of intersection with the axis 56 are prolonged, these axes intersect each other. In these conditions, the additional sections 62, 64 may be omitted.

Figure 17:
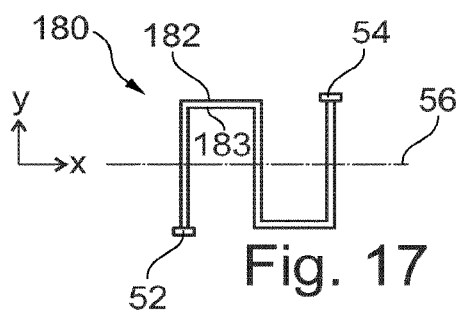

FIG. 17 shows a coil 180 identical to the coil 40, except that it has Q metal lines which wind around the axis 56 while remaining practically always parallel to each other, where Q is a whole number greater than 2 and preferably greater than 3 or 5. A structure for conductors used to form the coil 180, similar to that known by the term "Litz wire", is thus obtained. Here, in order to simplify FIG. 17, only two metal sections 182 and 183 are shown. These two lines 182 and 183 make mechanical and electrical contact with each other solely at the ends 52 and 54. Considered individually, each of these lines 182 and 183 has a structure identical or very similar to the line 50. The fact of using several metal lines reduces the resistivity of the inductor 180.

FIGS. 18 to 21 show different possible arrangements of the two coils, in relation to each other, so as to form an inductor able to be used instead of the inductor 10, 120 or 130.

Figure 18:
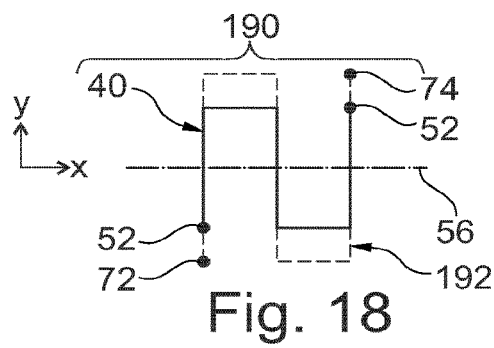
FIGS. 18 to 21 are schematic top-plan views of different possible arrangements of a coil in relation to the other coil of the inductor.
Figure 19:
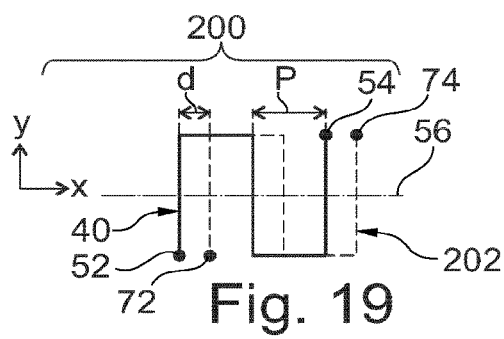
Figure 20:
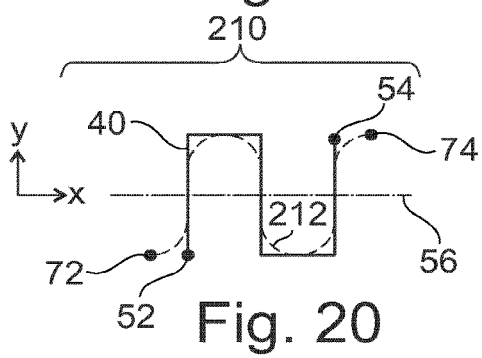

FIGS. 18 to 20 show embodiments where the surface area of the intersection between the orthogonal projections of the two coils in the same horizontal plane is smaller than the surface area of the orthogonal projection of one of these coils in this horizontal plane.

FIG. 18 shows an inductor 190 which is identical to the inductor 10, 120 or 130, except that the coil 42 is replaced by a coil 192 represented by a broken line. The coil 192 is identical to the coil 42, except that the length of each of the sections parallel to the direction X is increased. In this case, the orthogonal projections of the ends 72, 74 of the coil 192 in a horizontal plane do not coincide with the orthogonal projections of the ends 52 and 54 in this same plane. Moreover, the surface area of the intersection between the orthogonal projections of the coils 40 and 192 is smaller than the surface area of the orthogonal projection of the coil 192 in this horizontal plane. Thus, in this embodiment, the orthogonal projections of the coils are only partially and not perfectly superimposed.

FIG. 19 shows an inductor 200 identical to the inductor 10, 120 or 130, except that the coil 42 is replaced by a coil 202. The coil 202 is identical to the coil 42, except that it is offset by a distance "d" in the direction X. The distance "d" is smaller than P/2 and, preferably, smaller than P/4 and advantageously smaller than P/8 or P/16. In this case, the surface area of the intersection of the orthogonal projections of the coils 202 and 40 in the same horizontal plane may be negligible, i.e. at least less than 100 times the surface area of the orthogonal projection of the coil 202 or 40 in this horizontal plane. Here, whatever the section of the coil 40, its orthogonal projection in the horizontal plane is spaced at a distance of less than ¼ of the orthogonal projection of a section of the coil 202 in this same horizontal plane. Typically, the spacing between these orthogonal projections of two sections is measured along the orthogonal projection of the axis 56 in this horizontal plane.

FIG. 20 shows an inductor 210 which is identical to the inductor 10, 120 or 130, except that the coil 42 is replaced by a coil 212. The coil 212 has here a sinusoidal form. The orthogonal projection of the coil 212 in a horizontal plane is:
tangential to the orthogonal projection of the coil 40 in this same plane at the points of intersection with the orthogonal projection of the axis 56 in this horizontal plane, and
tangential to the centers of the orthogonal projections of the sections 62 and 64 in this horizontal plane.

In this case also, the surface area of the intersection of the orthogonal projections of the coils 40 and 212 in a same horizontal plane is negligible.

Figure 21:
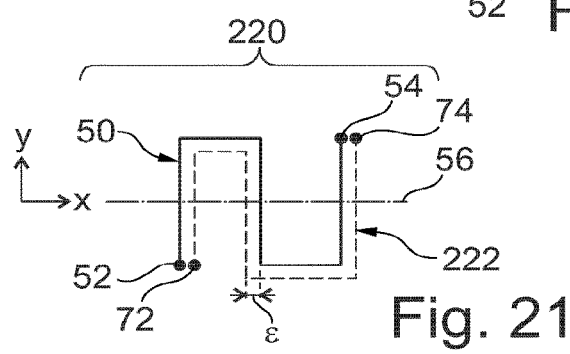

FIG. 21 shows an inductor 220 which is identical to the inductor 10, 120 or 130, except that the coil 42 is replaced by a coil 212 which is formed in the same metallization layer 24 as the coil 40. Thus, in this embodiment, the two coils 222 and 40 are situated in the same horizontal plane and are not arranged above one another. The coil 222 has a metal line 224 which follows the metal line 50 while maintaining a constant spacing E, and never crosses this metal line 50. The smaller the spacing E, the closer the absolute value of the magnetic coupling coefficient k is to 1.

CHAPTER II: VARIANTS

Chapter II.1: Variants of the Coil:

The coils may be made of other conductive materials such as gold or silver.

The coils may also be made by means of methods other than photolithography and etching. For example, in certain variants, they are made by means of electrolysis, silk-screen printing or ink jet printing.

The number N of sections of a coil must be greater than or equal to two and may be greater than or equal to three, ten or twenty.

In variants, the width of the line 50 is not constant over its length. For example, the width of the sections 58 to 60 is greater than the width of the sections 62 and 64.

In variants, the interval "P" which separates the different sections which intersect the axis 56 of a same metal line is not uniform. In this case, the distance "I" between two sections immediately consecutive in the direction X is not always the same.

The different embodiments of the section described here and the different arrangements of the coils relative to each other described here may be combined in many different ways so as to obtain new embodiments. For example, the different forms of the sections described with reference to FIGS. 13 to 17 may be implemented in any one of the arrangements described with reference to FIGS. 18 to 21.

The section 180 may have more than two metal lines parallel to each other. In another variant, the metal lines 182 to 183 are not parallel to each other.

Chapter II.2 Variants of the Inductor:

The interval "P" between the adjacent sections may be less small than or equal to the thickness "e". In this case, the ratio e/P is greater than or equal to 1.

In another variant, the inductor has more than two or three coils magnetically coupled together. In this case, the inductor has several pairs of immediately adjacent coils. For example, these coils are superimposed on top of one another in the direction Z. Each pair of immediately adjacent coils is arranged as described above in the case of the inductor 10, namely in the case of an inductor having only one pair of coils. The value of this inductor with more than two coils may be variable. In this case, for example, the control circuit described in the particular case of two coils is adapted so as to be able to connect each pair of coils of this inductor together with more than two coils in one of the configurations described above. In particular, in one configuration, all the coils are connected in series and the alternating currents which flow, at the same instants, in sections immediately adjacent in the direction Z are in phase opposition. Preferably, in the case of an inductor with more than two coils, the control circuit allows the connection of certain pairs of adjacent coils in the first configuration and other pairs of adjacent coils in the second or third configuration. As a result, it is possible to adjust a large number of different values for this inductor with more than two coils. Similarly, the inductor 220 may have more than two or three coils magnetically coupled together and all situated in the same metallization layer.

In another embodiment, the value of the inductor is adjusted not by modifying the electrical connections between the coils and therefore, in particular, by altering the direction of flow of the current in these coils, but by varying the strength of the current in one of the coils. In such an embodiment of a variable inductor, the controllable switches are for example omitted and replaced by a circuit, such as a controllable current source, designed to modify the strength of the current flowing in one of the coils. By varying the intensity of the current in one of the coils, the mutual inductance and therefore the value of the inductor are modified. These embodiments of a variable inductor function as described with reference to FIGS. 15a, 15a, 15b, 16a, 16b and 17 of the application U.S. Pat. No. 5,095,357. For example, these embodiments differ from those described in FIGS. 15a, 15b, 16a, 16b and 17 of application U.S. Pat. No. 5,095,355 simply in that serpentine coils are used instead of loop or spiral coils. As a result, the current induction in the ground plane is greatly reduced.

Chapter II.3: Other Variants:

Materials other than vanadium dioxide may be used to manufacture the switches of the control circuit 44. For example, GeTe may be used instead of vanadium dioxide.

The switches may also be made using other technologies and without the use of phase-change materials. For example, the switches may be transistors such as field effect transistors known by the abbreviation MOSFET (Metal Oxide Semiconductor Field Effect Transistor).

The circuit 44 and its switches may be formed in locations other than in the layer 22. For example, they may also be formed in the dielectric layers 28 and 30. They may also be formed in or mounted on the outer surface of the layer 26.

The variable inductor may be used to form other tunable integrated circuits. For example, the variable inductor described here may also advantageously replace the variable inductor in one of the integrated circuits described in the application U.S. Pat. No. 5,095,357 and, in particular, in order form the circuits illustrated in FIGS. 18 and 19 of this application. The variable inductor described here may also be used to form low-pass or high-pass filters.

In another variant, the capacitor 12 is a capacitor with a capacitance which can be varied and adjusted by means of the control circuit.

CHAPTER III. ADVANTAGES OF THE EMBODIMENTS DESCRIBED HERE

Serpentine coils do not have any loops. They therefore generate much less eddy current in the conductor or semiconductor layer 22 of the underlying substrate. Moreover, they are simple to manufacture using conventional methods for manufacturing integrated circuits. The use of serpentine coils therefore allows the generation of eddy current to be limited, without complicating the manufacture of the integrated circuits. In particular, with such coils it is possible, at least in certain cases, to avoid the use of a ground plane in order to insulate the coils from the conductor or semiconductor layer 22.

In the first configuration, the inductance of each coil is equal to the difference between its self-inductance and the mutual inductance. With this first configuration, therefore, a very weak inductance value may be obtained. Conversely, with the second and third configurations much higher inductance values may be obtained. Thus it is possible to obtain a ratio for the values $L_3/L_1$ or $L_2/L_1$ much higher than what is possible with the known variable inductors.

Since one of the configurations of the variable inductor is the first configuration it is possible to obtain a ratio between the two adjustable values of the inductance higher than 2 or 2.3 when the coefficient k is greater than 0.4.

Since the control circuit has five switches, with the aid of only two coils it is possible to obtain three different values for the inductance.

Since the control circuit is not present and the inductor coils are permanently connected in the first configuration and the absolute value of the coefficient k is higher than 0.6, an inductance with a very low value, i.e. less than 100 pH or 10 pH, may be easily obtained. Such very low inductance values are difficult to achieve with the known inductors having two loop coils. Indeed, in order to obtain such low values with loop coils, the surface area of the loop must be reduced. The smaller the surface area of the loop, the greater the value of the parasitic capacitance. The increase in the parasitic capacitance causes a deterioration of the inductor performance in particular at a high frequency.

By arranging the coils in relation to each other so that the coefficient k is greater than 0.9 it is possible to obtain an inductance with a value strictly less than 100 pH or 10 pH.

By using a magnetic core having a relative permeability $\mu_{rv}$ greater than its relative permeability $\mu_{rh}$ the absolute value of the coefficient k may be increased. The higher the absolute value of the coefficient k, the lower the value $L_1$ of the inductance.

Owing to the fact that the orthogonal projections of the coils in the horizontal plane are superimposed by more than 50% the absolute value of the coefficient k may be increased.

As a result of a ratio e/I which is strictly less than 1 it is possible to obtain a significant vertical magnetic coupling between the coils and, at the same time, a high value $L_p$ for the self-inductances of the coils 40, 42. This therefore allows the inductance values $L_2$ and $L_3$ to be maximized Since the ratio I/L is less than 3 or 1, the difference between the value $L_1$ and the value $L_2$ or $L_3$ of the inductance may be increased substantially.

The invention claimed is:

1. An integrated circuit comprising:
a substrate extending mainly in a substrate plane, and
an inductor comprising:
an input terminal,
an output terminal, and
first and second coils which are magnetically coupled together, the magnetic coupling resulting in formation of a mutual inductance M between the two coils when the inductor is energized, the mutual inductance M being defined by the following relation:
M=k sqrt($L_{40}L_{42}$), where:

k is a magnetic coupling coefficient, and
$L_{40}$ and $L_{42}$ are self-inductances of the first and second coils, respectively, and
sqrt( . . . ) is the square root function,
wherein
each of the first and second coils comprises a metal line which extends continuously, in a plane parallel to the substrate plane and advancing in the same direction, between a first and second end, the metal line following a winding path around an axis of the respective coil parallel to the substrate plane, the respective line comprising a succession of sections which each intersect the axis of the coil and are electrically connected in series with each other,
the inductor is a variable inductor where an inductance value of the inductor varies between first and second different values, the variable inductor comprising a control circuit which is controllable so as to modify a direction or a strength of a current which flows in at least one of the first and second coils so as to cause a variation of the mutual inductance M and therefore cause the inductance value to be variable between the first and second values, and
the axes of the first and second coils are parallel and each section of the metal line of the first coil is immediately adjacent to a corresponding section of the metal line of the second coil,
the absolute value of the coefficient k is comprised within a range 0.4 to 1, and
the control circuit comprises controllable switches designed to electrically connect together the first and second coils in one of:
a first configuration where the first and second coils are connected in series and in which:
the first end of the metal line of the first coil is directly connected to the output terminal,
the second end of the metal line of the first coil is directly connected to the second end of the metal line of the second coil, and
the first end of the metal line of the second coil is directly connected to the input terminal,
so that, for each section of the metal line of the first coil, the current which flows therein is in phase opposition to the current which flows in an immediately adjacent section of the metal line of the second coil, and
at least one other configuration chosen from the group consisting of a second and a third configuration, wherein
in the second configuration the first and second coils are connected in series and:
the first end of the metal line of the first coil is directly connected to the second end of the metal line of the second coil,
the second end of the metal line of the first coil is directly connected to the output terminal, and
the first end of the metal line of the second coil is directly connected to the input terminal,
so that, for each section of the metal line of the first coil, the current which flows therein is in phase with the current which flows in an immediately adjacent section of the metal line of the second coil, and
in the third configuration the first and second coils are connected in parallel and, for each section of the metal line of the first coil, the current which flows therein is in phase with the current which flows in an immediately adjacent section of the metal line of the second coil.

2. The integrated circuit as claimed in claim 1, wherein the at least one other configuration is the second configuration.

3. The integrated circuit as claimed claim 1, wherein:
the inductor comprises:
the input terminal being electrically connected permanently to the first end of the metal line of the second coil, and
the output terminal, and
the control circuit comprises:
a first switch designed to electrically isolate or electrically connect directly the first ends of the metal lines of the first and second coils,
a second switch designed to electrically isolate or electrically connect directly the second ends of the metal lines of the first and second coils,
a third switch designed to electrically isolate or electrically connect directly the second end of the metal line of the second coil to the first end of the metal line of the first coil,
a fourth switch designed to electrically isolate or electrically connect directly the first end of the metal line of the first coil to the output terminal, and
a fifth switch designed to electrically isolate or electrically connect directly the second end of the metal line of the first coil to the output terminal.

4. The integrated circuit as claimed in claim 1, wherein the second value of the inductance is at least twice the first value.

5. The integrated circuit as claimed in claim 1, wherein the first and second coils are arranged relative to each other in such a way that the absolute value of the magnetic coupling coefficient k is greater than 0.6.

6. The integrated circuit as claimed in claim 1, wherein:
the first and second coils are formed, respectively, in a first metallization layer and a second metallization layer arranged below one another in a vertical direction perpendicular to the substrate plane, and
the integrated circuit comprises a magnetic core which extends in the vertical direction so as to connect magnetically each section of the metal line of the first coil to the immediately adjacent section of the metal line of the second coil, the magnetic core having a relative permeability $\mu_{rv}$ in the vertical direction greater than 1 and a relative permeability $\mu_{rh}$ in a direction perpendicular to the vertical direction less than the permeability $\mu_{rv}$.

7. The integrated circuit as claimed in claim 1, wherein:
the first and second coils are arranged below one another in a direction perpendicular to the substrate plane, and
an orthogonal projection of the first coil in a projection plane parallel to the substrate plane covers at least 50% of an orthogonal projection of the second coil in the projection plane.

8. The integrated circuit as claimed in claim 1, wherein:
the first and second coils are arranged below one another in a vertical direction perpendicular to the substrate plane and spaced from one another in this the vertical direction at a distance "e", and
for each of the first and second coils:
each section immediately adjacent, in the succession of sections, to another section of the coil is spaced from the another section by a distance "l" measured along the axis of the coil, and for each pair of immediately adjacent sections of the coil the ratio e/l is less than 0.5.

9. The integrated circuit as claimed in claim 1, wherein, for each of the first and second coils:
- each section immediately adjacent, in the succession of sections, to another section of the coil is spaced from the other section by a distance "l" measured along the axis of the coil, and
- for each pair of immediately adjacent sections of the coil, the ratio l/L is less than 3, where "L" is the width of the sections of the coil in a direction parallel to the axis of the coil.

10. The integrated circuit as claimed in claim 1, wherein:
- each section immediately adjacent, in the succession of sections, to another section is the identical repetition of the another section, but offset, in a direction parallel to the axis of the coil, by a predefined distance, and
- the sections in the succession of sections are electrically connected in series with each other in such a way that the currents designed to flow in each pair of immediately adjacent sections are systematically in phase opposition when the corresponding metal line is energized via the first and seconds ends thereof.

11. The integrated circuit as claimed in claim 1, wherein the first and second coils are arranged relative to each other in such a way that the absolute value of the magnetic coupling coefficient k is greater than 0.9.

12. The integrated circuit as claimed in claim 1, wherein, for each of the first and second coils:
- each section immediately adjacent, in the succession of sections, to another section of the coil is spaced from the other section by a distance "l" measured along the axis of the coil, and
- for each pair of immediately adjacent sections of the coil, the ratio l/L is less than 1, where "L" is the width of the sections of the coil in a direction parallel to the axis of the coil.

* * * * *